United States Patent [19]

Vackier et al.

[11] Patent Number: 5,244,697

[45] Date of Patent: Sep. 14, 1993

[54] DIP COATER

[75] Inventors: Leo N. Vackier, 's-Gravenwezel; Stefaan K. De Meutter, Zandhoven, both of Belgium

[73] Assignee: AFGA-Gevaert N.V., Mortsel, Belgium

[21] Appl. No.: 704,352

[22] Filed: May 23, 1991

[51] Int. Cl.$^5$ ............................................. B05D 1/18
[52] U.S. Cl. ................................ 427/430.1; 118/421; 118/423
[58] Field of Search ...................... 427/430.1; 118/421, 118/423

[56] References Cited

U.S. PATENT DOCUMENTS

| | | |
|---|---|---|
| 2,508,200 | 5/1950 | Tarlton et al. |
| 2,617,163 | 11/1952 | Jeter et al. ..................... 118/421 X |
| 4,032,370 | 6/1977 | Mataré ........................... 118/421 X |
| 4,341,817 | 7/1982 | Tozier et al. ................ 427/430.1 X |
| 4,597,931 | 7/1986 | Watanabe et al. ........... 427/430.1 X |

FOREIGN PATENT DOCUMENTS 57-7280 1/1982 Japan .

OTHER PUBLICATIONS

Denshi Shashin Gakkaishi: vol. 28, No. 2 (1989) pp. 186-195 "Industrial Technology for Organic Photoreceptor" by M. Aizawa.

Primary Examiner—Janyce Bell
Attorney, Agent, or Firm—William J. Daniel

[57] ABSTRACT

A drum, such as a drum for an electrostatic photocopying unit, is given a uniform coating of a liquid coating composition, such as an organic photoconductor, by arranging the drum on a vertical axis coaxially with a vessel containing a body of the coating composition of a depth generally equal to the vertical length of the drum, bringing the drum and vessel into substantially telescoping relation to dip the drum substantially into the coating composition, and causing the drum and vessel to undergo relative vertical displacement along the vertical axis by the sole force of gravity to thereby bring about a progressive vertical separation of the drum from the vessel leaving a coating of the composition on the drum surface. The separation is preferably controlled at a uniform rate by means e. g. of a hydraulic cylinder supporting a movable one of the drum and vessel in opposition to the force of gravity while the gravitational force can be augmented by increasing the effective mass of the movable one.

9 Claims, 2 Drawing Sheets

DIP COATER

BACKGROUND OF THE INVENTION

1. Field of the Invention

The present invention relates to a method for coating the peripheral surface of a drum with a coating composition, and to a dipcoater for carrying out this method. In particular it relates to a dip coater for the coating of an organic photoconductor on a drum which is used in an electrophotographic apparatus for exposure to an image in order to produce an electrostatic charge pattern which may be developed by a suitable toner. The toner pattern is then transferred to a support such as plain paper, a foil for forming an offset plate, etc.

2. Description of the prior art

Organic photoconductors typically comprise one or more active layers involved in charge generation and/or charge transport with optional additional adhesion, blocking and protective layers. In one embodiment, they comprise a primer layer, a charge-generating layer and a charge-transport layer, on an electrically conductive support. The support may have the form of a drum or a belt. In the case of a drum, a cylindrical tube of aluminum or the like is clamped between two end flanges that fit on a rod that forms the rotational shaft from the drum in an electrophotographic copying or printing apparatus.

The distinct layers must be coated with a very good uniformity on the conductive support since their quality affects the quality of the final image.

The coating of a cylindrical support constitutes a particular case in the coating technology of the photographic industry, since it is a discontinuous process as distinct from the continuous coating of film and paper webs. Known methods for the coating of a drum with a coating composition are evaporation coating, spray coating, ring coating and dip coating. A good survey of these methods and their particularities is given in the article "Industrial Technology for an organic photoconductor" by Masao AIZAWA, in Denshi Shashin Gakkashi, Vol. 28, no. 2, 1989, pages 186-195.

Dip coating is mainly used for the large scale production of organic photoconductors. It is performed in practice with a coating vessel open at the top end which is filled with the coating composition, and into which a drum is dipped and then upwardly removed at a uniform speed. The thickness of the coated layer depends on the coating speed, i.e. the velocity of removal of the drum from the coating composition, and on the viscosity of the coating composition. For achieving uniformily of the coating, it is highly important that the coating speed be constant, and that the movement of the drum be free of vibrations, shocks, and other disturbances.

Know motor means such as screw spindle drives, air and hydraulic cylinders do not operate completely vibration-free, and thereby they cause problems for the satisfactory upward driving of the drum in the described application.

SUMMARY OF THE INVENTION

Object of the invention

It is the object of the present invention to provide a method and a dip coater for the coating of a drum, wherein the control of the relative movement between the drum and a body of coating composition is such that a vibration-free coating is easy to obtain.

Statement of the Invention

According to the present invention a method is provided for coating the peripheral surface of a drum with a coating composition, which comprises holding the drum to be coated in a vertical position, dipping the drum into a vessel containing the coating composition and displacing coating vessel and drum relatively away from each other thereby causing a progressive separation of the drum from a body of coating composition in the vessel so that a thin layer of coating composition remains adherent to the drum, which is characterized thereby that the relative displacement of the coating vessel and the drum away from each other is carried out under the sole influence of gravity.

A dip coater according to the present invention for coating the peripheral surface of a drum with a coating composition, which comprises a coating vessel for holding a given amount of coating composition, a support for supporting a drum to be coated in a vertical position, dip control means for causing the dipping of the drum into the coating vessel, and coating control means for causing the drum and the coating vessel to become displaced relatively to one another thereby causing a progressive separation of the drum and a body of coating composition in the vessel so that a thin layer of coating composition remains adherent to the drum, is characterized in that the coating control means is formed by brake means controlling the rate of the progressive relative separation of the drum and the vessel from each other under the sole influence of gravity.

The improved results of the coater according to the present invention are due to the fact that for the coating no motor is used to produce the relative displacement between the drum and the coating composition. On the contrary, gravity alone provides the required force for separating the vessel with coating composition and the drum, by acting on the effective movable mass of the vessel.

This is different from the operation as disclosed in US-A 2 508 200 relating to a depth of dip control apparatus in which downward displacement of a vessel with coating composition occurs by a fluid under pressure. Since the pressurizing of the fluid occurs by a displacement-type pump, it will be understood that pulsations of the pump mechanism will be transmitted by the fluid to the hydraulic cylinder bearing the coating vessel. If such vessel would be used for the precision coating of a photoconductor drum as envisaged in the present specification, the uniformity of coating would be unsatisfactory.

It should be understood that the term "drum" as used in the present statement of invention and throughout the further description of the specification, stands in fact for a cylinder- or sleeve-like member, such as an aluminum tube, which receives one or more coatings at is peripheral surface, and which then is assembled with two end flanges on a shaft to constitute the final electrophotographic drum.

According to a suitable embodiment of the invention, the prime means for moving the coating vessel upwardly is formed by a single-acting hydraulic cylinder, and the rate of descent of the vessel by a controlled restricted opening in an hydraulic outlet circuit of this cylinder. The outlet circuit of the cylinder remains closed during the upward displacement o the coating vessel, and the restrictor is opened in a controlled manner during the lowering of the vessel.

The described restricted opening may be formed by a remote-controlled valve which is controllable to obtain a pre-set lowering, i.e. coating speed. The opening of the valve to start the coating may occur progressively to avoid transient phenomena at the start of the coating.

According to another suitable embodiment of the invention, the mass of the moveable parts of the apparatus is increased by the provision of additional, dead mass. This measure results in an increase of the force that propels the coating vessel downwardly and in improved damping of incidental vibration.

BRIEF DESCRIPTION OF THE DRAWINGS

The invention will be described hereinafter by way of example with reference to the accompanying drawings wherein:

Referring to FIG. 1, a dip coater as generally indicated by the arrow 10 basically comprises a vertical single-acting hydraulic cylinder 11 with a piston 40, and a vertical frame 12 inside which a coating vessel 13 and a drum 14 to be coated are located. The hydraulic cylinder 11 and the frame 12 are both mounted on a ground plate 25. The piston rod 15 of the cylinder bears at its upper end a yoke 16 with two supporting rods 17 and 18. A base plate 19 is fitted to the lower end of the rods and supports a number of steel plates 20 that serve to increase the total mass of the moveable parts of the apparatus. The plates 20 have a circular central opening that is sufficiently wide to fit with a large clearance round the housing of the hydraulic cylinder. The extending ends 21 and 23 of the base plate 19 have bores that co-operate with stationary vertical guide rods 24 and 26, indicated in broken lines, that provide for the vertical guidance of the moving system, and that also determine the angular position of the system.

Figure 1:
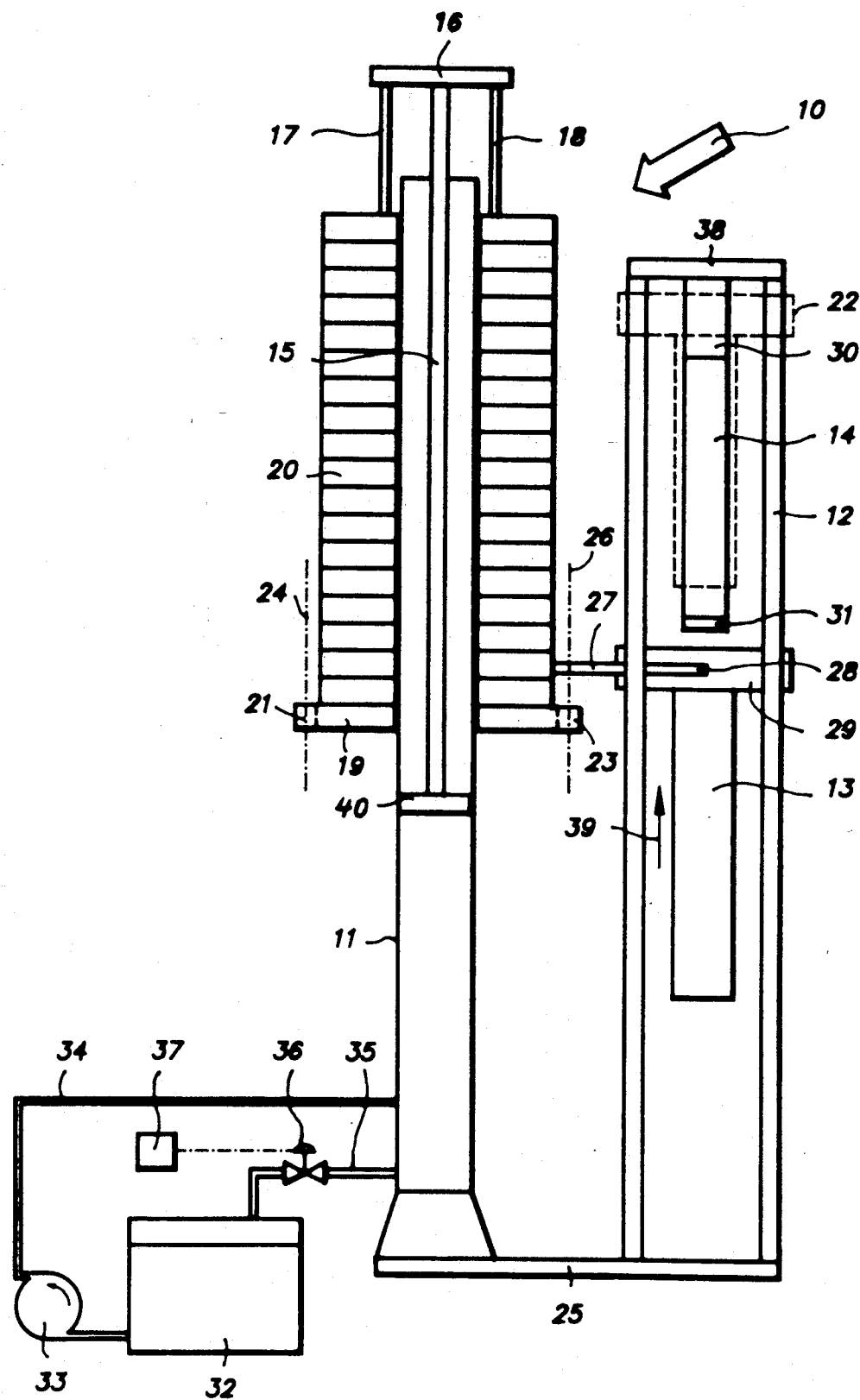
FIG. 1 is a diagrammatic illustration of one embodiment of a dip coater according to the present invention.

A horizontal arm 27 is fitted via an intermediate support (not shown) to the base plate 19 and ends in a fork 28 for supporting the coating vessel 13. The coating vessel 13 is a cylindrical vessel having at its open top a collar-like extension 29. The drum 14 to be coated is vertically supported between a cylindrical support 30 at the upper end and a plug 31 at the lower end.

Support 30 is permanently mounted at the top 38 of the frame 12. Plug 31 is fitted to the lower extremity of a central pull rod (not shown) that pulls the plug upwardly and thus clamps the drum to be coated against the support 30. Plug 31 as well as support 30 provide liquid-tight seals with the drum 14. The control of the clamping action of the pulling rod may be manual, hydraulic, etc.

The axes of the coating vessel 13 and of the drum 14 coincide with each other and also with the central axis of the frame structure 12. It should be understood that the frame 12 does neither form a guide for the coating vessel, nor for the supporting fork 28, but only functions as a support for the drum 14 being coated.

The dip coater described so far is operated by means of an hydraulic system which comprise a supply tank 32 for the hydraulic oil, a positive displacement-type pump 33, an inlet conduit 34, an outlet conduit 35 and an adjustable valve 36 which is remote-controlled by a controller 37 to obtain a setting which will produce the desired coating speed.

The operation of the apparatus is described hereinafter. The coating vessel 13 being in the lower position as illustrated, a desired amount of electrophotographic coating composition is poured into the vessel. This coating composition has previously been deaerated in a vacuum deaerator or the like.

A drum 14 which may be provided with a suitable primer layer is fitted into the frame 12 as described hereinbefore.

Valve 36 is closed and pump 33 is started to raise piston 40 to the hydraulic cylinder 11 to its highest position. The coating vessel 13 that is connected to the piston rod 15 is raised simultaneously as indicated by the arrow 39, to its highest position 22 as indicated by broken lines. The vertical displacement of the coating vessel occurs sufficiently slowly to avoid entrapment of air in the coating liquid. The immersion of the drum 14 into the coating vessel 13 causes a considerable displacement of the coating composition therein, and this displaced volume is received in the collar-like extension 29 of the vessel.

Then valve 36 is re-opened to initiate the lowering of the coating vessel. The opening of the valve to the desired value does not occur instantly but is programmed to occur progressively in order to avid transient phenomena at the start which otherwise could cause ruffling of the free surface of the coating composition and thereby non-uniformities in the coated layer.

Figure 2:
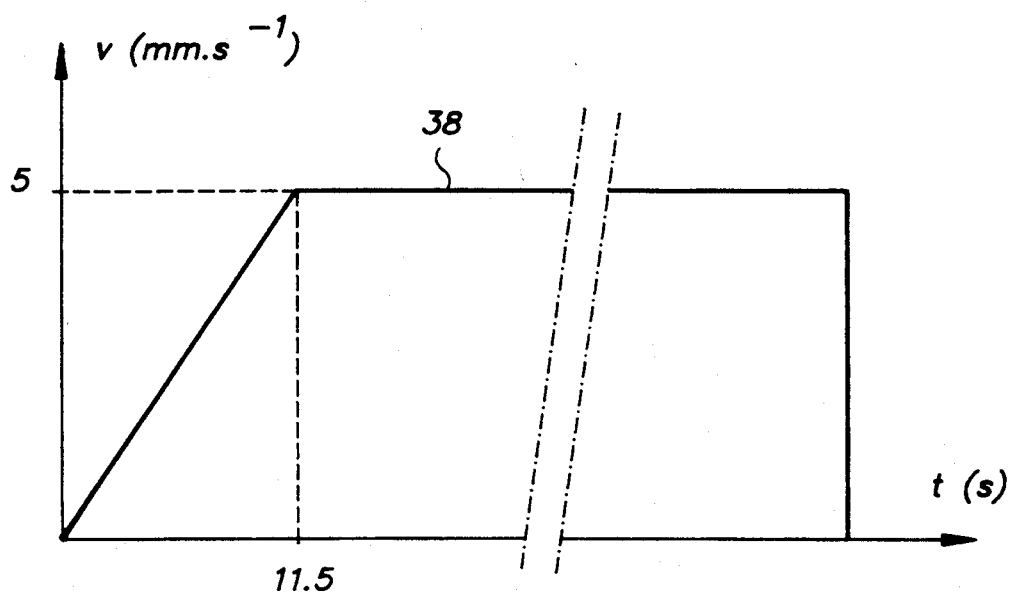
FIG. 2 is a diagram illustrating the speed of the coating vessel during coating.

The control of the valve is illustrated by way of example in the diagram 38 of FIG. 2 which shows the lowering speed of the coating vessel as a function of time. In the present example, the nominal coating speed of 5 mm.s$^{-1}$ was obtained after 11.5 s. The time which elapses before the mechanism reaches its lowest position depends on the coating speed and on the length of the drum.

During the lowering of the coating vessel, drum 14 is progressively withdrawn from the coating composition which flows smoothly from the periphery of the drum and dries almost instantly as the drum becomes exposed to the air since the solvent of the coating composition was methylene chloride. After the bottom of the drum has cleared the coating composition, the lowering of the coating vessel continues for a further distance of approximately 10 cm.

It should be understood that the coating vessel need not be lowered to its very lowest position or raised to its highest position. As a matter of fact, arm 27 may have a flag co-operating with sensors known in the art, that are located at different heights on a vertical beam of the frame 12. The sensor that corresponds with a particular drum length is connected in the control circuit of the valve 36 so that lowering of the coating vessel is stopped after the mentioned 10 cm separation has been obtained.

In this position, drum 14 has completely emerged from the coating vessel as shown in FIG. 1. The operator then removes the coated drum from the apparatus and brings it to a drying chamber for the ultimate drying to remove residual solvents from the coated layer.

The following data illustrate the described dip coater:
course of hydraulic cylinder 11: 1200 mm
total mass of plates 20: 500 kg
coating speed: adjustable between 1.00 and 400 mm.s$^{-1}$
dry layer thickness: between 0.1 and 30 micrometer drum size: diameter up to 200 mm length up to 600 mm coating vessel: four liter coating comprising suffice for the coating of approximately 50 drums of a size of 80×350 mm It will be understood that the dip coater according to the present invention is not limited to the described example. Other motor means than a hydraulic cylinder may be used to raise the coating vessel to its elevated position in which the drum is immersed into the coating composition.

Other brake means may be used to control the lowering of the coating vessel, it being understood that in an event it is the acceleration of gravity which is operative to create the force which causes the lowering of the coating vessel.

The guide rods 24 and 26 have been illustrated very diagrammatically in FIG. 1. It will be understood that in practice suchlike rods may form part of a sturdy frame fitted to the base plate of the coater, and in such a case the lower connection point of the hydraulic drum may be pivotable to avoid torsion forces in the system.

The support 30 and the plug 31 may be easily exchangeable for other elements to suit different drum sizes. The same exchangeability is applicable to the support 28 for the coating vessel.

The aggregate mass of the plates 20 may be varied by taking away or adding a number of plates. The choice of the mass of these plates is related to the type of valve 36 used in the system, and also to the degree of opening of the valve. Further, this mass depends on the required stability of the apparatus, and on the contents of the coating vessel.

The opening of the valve 36 to the required valve need not necessarily occur linearly as illustrated in FIG. 2, but may occur according to any suitable function.

We claim:

1. A method for uniformly coating the peripheral surface of a drum which comprises the steps of arranging said drum coaxially on a vertical axis with a vessel having an open upper end and containing a body of a liquid coating composition of a depth generally equal to the axial length of said drum, bringing said drum and vessel into vertically substantially telescoping relation to dip the drum substantially into said body of coating composition and then causing said drum and vessel to undergo relative displacement in a vertical direction away from said substantially telescoping relation by the sole force of gravity to thereby bring about a progressive separation of said drum from the body of coating composition and leave a uniform coating of the coating composition on the drum surface.

2. The method of claim 1 which includes the step of controlling the rate of relative vertical displacement between said drum and the vessel containing the coating composition.

3. The method of claim 2 wherein the relative vertical displacement between said drum and said vessel takes place at a substantially uniform rate.

4. The method of claim 2 wherein the force gravity causing the relative vertical displacement of said drum and vessel is opposed by a hydraulic fluid contained within a hydraulic cylinder and the rate of relative vertical displacement is controlled by adjusting the rate of flow of the hydraulic fluid out of the hydraulic cylinder.

5. The method of claim 4 where said vessel is supported against the force of gravity by the hydraulic fluid in said hydraulic cylinder in a position in telescoping relation with the drum and is caused to undergo downward displacement relative to said drum by the rate of flow of said hydraulic fluid out of said cylinder and after the separation of the drum and vessel is complete and the coated drum is replaced by a fresh drum to be coated, hydraulic fluid is introduced under pressure into said cylinder to return the vessel to its position for said telescoping relation.

6. The method of claim 1 wherein one of said drum and vessel is caused to move by gravity in a vertical direction while the other remains in substantially fixed vertical position to thereby bring about the relative vertical displacement and including the step of augmenting the effective mass of the moving one of said drum and vessel to increase its response to the force of gravity.

7. The method of claim 2 wherein the force of gravity causing the relative vertical displacement of said drum and vessel is opposed by a hydraulic fluid contained within a hydraulic cylinder and including the step of regulating the flow of said hydraulic fluid from said hydraulic cylinder by means of a valve which is adapted to be opened to begin said relative vertical displacement.

8. The method of claim 7 including the step of opening said valve gradually in order to avoid disturbance of the surface of the body of liquid coating composition at the start of said vertical displacement.

9. The method of claim 8 wherein after the initial gradual opening of said valve, the flow of hydraulic fluid from said hydraulic cylinder is maintained at a generally constant rate to cause said relative vertical displacement to take place at a generally constant rate.

* * * * *